(12) United States Patent
Tsukamoto et al.

(10) Patent No.: US 7,883,930 B2
(45) Date of Patent: Feb. 8, 2011

(54) PHASE CHANGE MEMORY INCLUDING A PLURALITY OF ELECTRICALLY CONDUCTIVE BODIES, AND MANUFACTURING METHOD THEREOF

(75) Inventors: Takayuki Tsukamoto, Palo Alto, CA (US); Katsuyuki Naito, Tokyo (JP); Sumio Ashida, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 12/184,428

(22) Filed: Aug. 1, 2008

(65) Prior Publication Data
US 2008/0293183 A1 Nov. 27, 2008

Related U.S. Application Data

(62) Division of application No. 11/272,751, filed on Nov. 15, 2005, now abandoned.

(30) Foreign Application Priority Data
May 19, 2005 (JP) ............................. 2005-146784

(51) Int. Cl.
*H01L 21/00* (2006.01)
(52) U.S. Cl. .................. 438/95; 438/900; 257/245; 257/246; 257/2
(58) Field of Classification Search ......... 257/245–247, 257/2–5; 438/95, 900
See application file for complete search history.

(56) References Cited

U.S. PATENT DOCUMENTS

| 6,670,628 | B2 | 12/2003 | Lee et al. |
| 6,746,892 | B2 | 6/2004 | Lee et al. |
| 7,288,781 | B2 | 10/2007 | Kozicki |
| 7,306,961 | B2* | 12/2007 | Nunoue et al. ............... 438/29 |
| 2002/0045323 | A1 | 4/2002 | Lowrey et al. |
| 2003/0031074 | A1 | 2/2003 | Tran et al. |
| 2004/0256662 | A1 | 12/2004 | Black et al. |
| 2006/0160304 | A1 | 7/2006 | Hsu et al. |
| 2007/0052009 | A1* | 3/2007 | Xie et al. ..................... 257/318 |

FOREIGN PATENT DOCUMENTS

| JP | 11-170378 | 6/1999 |
| JP | 2003-155365 | 5/2003 |

(Continued)

OTHER PUBLICATIONS

E. Varesi, et al., "Advance in Phase Change Memory Technology", Proceedings of EPCOS 2004, paper 16, Sep. 4, 2004, 8 pages.

*Primary Examiner*—Bradley K Smith
*Assistant Examiner*—Jami M Valentine
(74) *Attorney, Agent, or Firm*—Oblon, Spivak, McClelland, Maier & Neustadt, L.L.P.

(57) ABSTRACT

A phase change memory including at least a storage cell which includes a first electrode, an electrically conductive portion provided on the first electrode and having at least two electrically conductive bodies with approximately the same shape provided on the first electrode, the electrically conductive bodies being spaced by a high resistance film with a high resistance, a recording layer provided on the electrically conductive portion and having phase change material which can change between a first phase state with a first specific resistance and a second phase state with a second specific resistance different from the first specific resistance, and a second electrode provided on the recording layer.

3 Claims, 13 Drawing Sheets

FOREIGN PATENT DOCUMENTS

| | | |
|---|---|---|
| JP | 2004-312002 | 11/2004 |
| WO | WO 03/050872 A1 | 6/2003 |
| WO | WO 03/085740 A1 | 10/2003 |
| WO | WO 2004/025640 A1 | 3/2004 |
| WO | WO 2005/041303 A1 | 5/2005 |

* cited by examiner

PHASE CHANGE MEMORY INCLUDING A PLURALITY OF ELECTRICALLY CONDUCTIVE BODIES, AND MANUFACTURING METHOD THEREOF

CROSS-REFERENCE TO RELATED APPLICATION

This application is a Divisional of and claims the benefit priority from U.S. Ser. No. 11/272,751, filed Nov. 15, 2005, which claims the benefit of priority from Japanese Patent Application No. 2005-146784, filed May 19, 2005, the entire contents of each of which are incorporated herein by reference.

BACKGROUND OF THE INVENTION

1. Field of the Invention

The present invention relates to a phase change memory where phase change material which is changeable in phase between a first phase state and a second phase state is used for storage cells and a manufacturing method thereof.

2. Related Art

A phase change memory in which information can be recorded or erased by applying electric energy such as current to the phase change memory has been known. Material for a recording layer used in the phase change memory causes phase change reversible between a crystal phase and an amorphous or non-crystal phase due to a temperature rising according to application of electric energy. In general, an electric resistance (or specific resistance) of the crystal phase is low, while that of the amorphous phase is high. The phase change memory is a memory which utilizes such a difference in electric resistance (or specific resistance) between the crystal phase and the amorphous phase to record and reproduce information. Accordingly, it is known that two states obtained by the phase change may be an ordered amorphous phase and a disordered amorphous phase instead of the crystal phase and the amorphous phase, if a sufficient resistance change occurs therebetween.

The phase change memory is generally provided with storage cells, each cell having a lower electrode, an electrically conductive portion provided on the lower electrode, a recording layer made from phase change material and provided on the electrically conductive portion, and an upper electrode provided on the recording layer. It is known that the recording layer made from phase change material is smaller in heat conductivity than the lower and upper electrodes or the electrically conductive portion. Therefore, even if current is caused to flow such that temperature rising occurs only in the vicinity of the electrically conductive portion in the storage cell, since heat stays within the recording layer made from phase change material, a region where temperature rising occurs within the recording layer made from phase change material becomes larger than that of the electrically conductive layer. As a result, when size reduction of the storage cell and further capacity increase are intended, there is such a problem that heating must be conducted to an unnecessary portion so that a necessary amount of current can not be reduced and thermal influence between adjacent storage cells can not be neglected. As means for solving the problem, such a technique that two electrically conductive portions with the same shape, each being formed to have a rectangular outer shape and having a square bored face at its central portion on a side of the recording layer, are arranged in parallel via an insulating film and a recording layer is constituted so as to come in contact with portions of the square bored faces of the two electrically conductive portions to reduce a sectional area on the side of the electrically conductive portions to the minimum so that a contact area between the electrically conductive portions and the recording layer is reduced sufficiently has been known (for example, see Non-Patent Literature 1 (E. Varesi et al., "Advance in Phase Change Memory Technology", Proceedings of EPCOS 2004, paper 16, http://www.epcos.org/E_PCOSO4.htm.)).

As described in the Non-Patent Literature 1, when a plurality of electrically conductive portions are provided to come in contact with a recording layer made from phase change material, unless a positional relationship among the electrically conductive portions is set to be equal among respective storage cells, it is difficult to obtain the same property among the storage cells. There is such a problem that it is difficult to control properties of the storage cells according to size reduction of the storage cell, namely according to advance to a mass storage memory, because the electrically conductive portion is also reduced in size.

SUMMARY OF THE INVENTION

The present invention has been made in view of these circumstances and an object thereof is to provide a phase change memory where properties of storage cells can be set to be approximately equal to one another and a current amount required for phase change can be reduced sufficiently even if the storage cell is reduced in size.

A phase change memory according to a first aspect of the present invention, includes at least a storage cell, the storage cell including: a first electrode; an electrically conductive portion having at least two electrically conductive bodies with approximately the same shape provided on the first electrode, the at least two electrically conductive bodies being spaced from one another by a high resistance film with a resistance higher than those of the at least two electrically conductive bodies; a recording layer being provided on the electrically conductive portion, and having phase change material which can change between a first phase state having a first specific resistance and a second phase state having a second specific resistance different from the first specific resistance; and a second electrode being provided on the recording layer.

A manufacturing method of a phase change memory according to a second aspect of the present invention, includes: forming a first electrode; forming an electrically conductive layer on the first electrode; forming a block copolymer layer having a self-ordered structure where first polymer phases and second polymer phases are approximately regularly arranged on the electrically conductive layer; selectively removing the first polymer phases to form a plurality of recesses on a surface of the block polymer layer; forming a plurality of electrically conductive bodies corresponding to the self-ordered structure of the block copolymer by utilizing the recesses as masks to perform etching process on the electrically conductive layer; forming a high resistance film with a resistance higher than that of the electrically conductive bodies among the plurality of electrically conductive bodies; forming a phase change material layer which can phase-change between a first phase state having a first specific resistance and a second phase state having a second specific resistance different from the first specific resistance on the plurality of electrically conductive bodies and the high resistance film; and forming a second electrode on the phase change material layer.

A manufacturing method of a phase change memory according to a third aspect of the present invention, includes:

forming a first electrode; forming an electrically conductive layer on the first electrode; forming a transfer layer on the electrically conductive layer; forming, on the transfer layer, a block copolymer layer having an ordered structure where first polymer phases and second polymer phases are approximately regularly arranged; selectively removing the first polymer phases to form a plurality of recesses on a surface of the block polymer layer; forming a pattern corresponding to the ordered structure of the block copolymer layer by utilizing the plurality of recesses as masks to etch the block copolymer layer and the transfer layer; forming a plurality of electrically conductive bodies corresponding to the ordered structure of the block copolymer layer by utilizing the transfer layer as a mask to perform etching process; forming a high resistance film with a resistance higher than the electrically conductive body among the plurality of electrically conductive bodies; forming a phase change material layer which can phase-change between a first phase state having a first specific resistance and a second phase state having a second specific resistance different from the first specific resistance on the plurality of electrically conductive bodies and the high resistance film; and forming a second electrode.

DETAILED DESCRIPTION OF THE INVENTION

Embodiments of a phase change memory and a manufacturing method thereof according to the present invention will be explained below in detail with reference to the drawings. Incidentally, the present invention is not limited by the embodiments.

In each embodiment of the present invention, such a configuration is employed that electrically conductive bodies arranged approximately regularly so as to come in contact with a recording layer made from phase change material are formed and diffusion of heat within the recording layer made from phase change material is utilized so that, even if a small amount of current is caused to flow between a lower electrode and an upper electrode, phase change occurs in the recording layer made from phase change material. Here, the expression "arranged approximately regularly" means a case typified by either one of the following constitutions. (1) Considering a specific section, constituent elements (electrically conductive bodies) are arranged in one axial direction within the section at approximately equal intervals and constituent elements (electrically conductive bodies) are arranged in another axial direction different from the one axial direction at approximately equal intervals. (2) Considering a specific section, all constituent elements (electrically conductive bodies) are arranged such that distances between respective two nearest constituent elements (electrically conductive bodies) are approximately fixed.

First Embodiment

A phase change memory according to a first embodiment of the present invention will be explained with reference to FIGS. 1 to 3. As shown in FIG. 3, the phase change memory of the embodiment is provided with a plurality of word lines $WL_i$ (i=1, ... ), a plurality of address lines $ADD_j$ (j=1, ... ) crossing these word lines, and storage cells 1 provided at crossing regions of respective word lines and respective address lines. One end of the storage cell 1 is directly connected to a corresponding word line, while the other end thereof is connected to a corresponding address line via a transistor 10 for cell selection. Incidentally, row selection lines $Row_i$ (i=1, ... ) for selecting one of transistors 10 are provided, and a gate of each transistor 10 is connected to a corresponding row selection line $Row_i$ (i=1, ... ). Diodes may be used instead of the transistors. In that case, the row selection lines $Row_i$ (i=1, ... ) become unnecessary.

Figure 1:
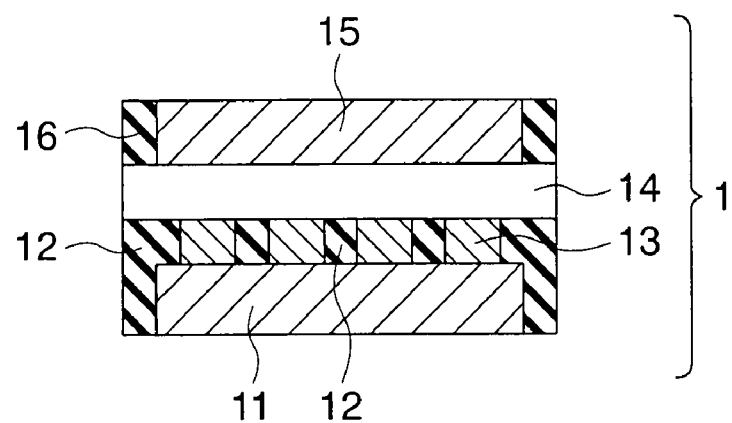
FIG. 1 is a sectional view showing a storage cell in a phase change memory according to a first embodiment of the present invention.

A section of the storage cell 1 in the phase change memory according to the embodiment is shown in FIG. 1. The storage cell 1 is provided with a lower electrode 11, electrically conductive bodies 13 which are disposed on the lower electrode 11 and spaced from one another by an insulating layer 12, a recording layer 14 which is disposed on the electrically conductive bodies 13 and is made from phase change material, and an upper electrode 15 which is disposed on the recording layer 14. The recording layer 14 made from phase change material is formed so as to spread over all storage cells uniformly. Incidentally, a side portion of the upper electrode 15 is covered by an insulating film 16. The lower electrode 11 is connected in series to the address line via the transistor 10 for cell selection shown in FIG. 3 and the upper electrode 15 is directly connected to the word line.

In the storage cell 1 shown in FIG. 1, when the recording layer 14 is heated up to about a melting point of the phase change material (for example, 600° C. or so) by applying a voltage between the lower electrode 11 and the upper electrode 15 to cause a current to flow from the lower electrode 11 to the upper electrode 15 via the electrically conductive bodies 13 and the recording layer 14, the phase change material layer 14 changes to an amorphous phase (a high resistance phase) and this amorphous phase is maintained even if application of the voltage is stopped. At that time, a resistance value in the high resistance phase is typically 100 kΩ. Similarly, when the recording layer 14 is heated up to approximately a temperature (for example, 130° C.) suitable for crystallization of the phase change material, the phase change material of the recording layer 14 changes to a crystal phase (a low resistance phase) and the crystal phase is maintained even if the heating is stopped. At that time, a resistance value of the low resistance phase is typically 2 kΩ.

By applying a voltage between the lower electrode 11 and the upper electrode 15 to heat the electrically conductive bodies 13 and the recording layer 14 made from phase change material in this manner, an electric resistance between the lower electrode 11 and the upper electrode 15 can be changed.

Whether the recording layer 14 in the storage cell 1 is in the crystal phase or in the amorphous phase can be known by applying such a low voltage which neither cause crystallization nor non-crystallization between the upper and lower electrodes 11 and 15 to read a voltage value or a current value between the electrodes. Therefore, it is made possible to record and reproduce information of 1 bit using one storage cell 1 by causing a state of the crystallization phase and a state of the amorphous phase to correspond to 0 and 1, or 1 and 0. Alternatively, when a resistance change between the crystal phase and the amorphous phase is sufficiently large, multi-bit data can be recorded and reproduced using one storage cell.

Next, arrangement of the electrically conductive bodies 13 in the storage cell 1 in phase change memory according to the embodiment will be explained with reference to FIG. 2. FIG. 2 is a plan view of the storage cell 1 as viewed from the lower electrode 11 side. Electrically conductive bodies 13 with approximately equal shapes are arranged only within a superimposing region 17 between the upper and lower electrodes 11 and 15. In FIG. 2, the superimposing region 17 is almost square and it has a structure where at least two electrically conductive bodies are arranged in both of two side directions of the square. It is preferable that the number of electrically conductive bodies 13 arranged in at least one direction of the two directions is in a range of 2 to about 10. There is such a problem that, when the number of electrically conductive bodies 13 is less than two, namely, one, it becomes difficult to obtain such an advantage as reduction in current and when the number exceeds 10, a size (a diameter L) of each electrically conductive body becomes excessively small so that it becomes difficult for a current to flow from the lower electrode 11 to the electrically conductive bodies 13.

Figure 4:
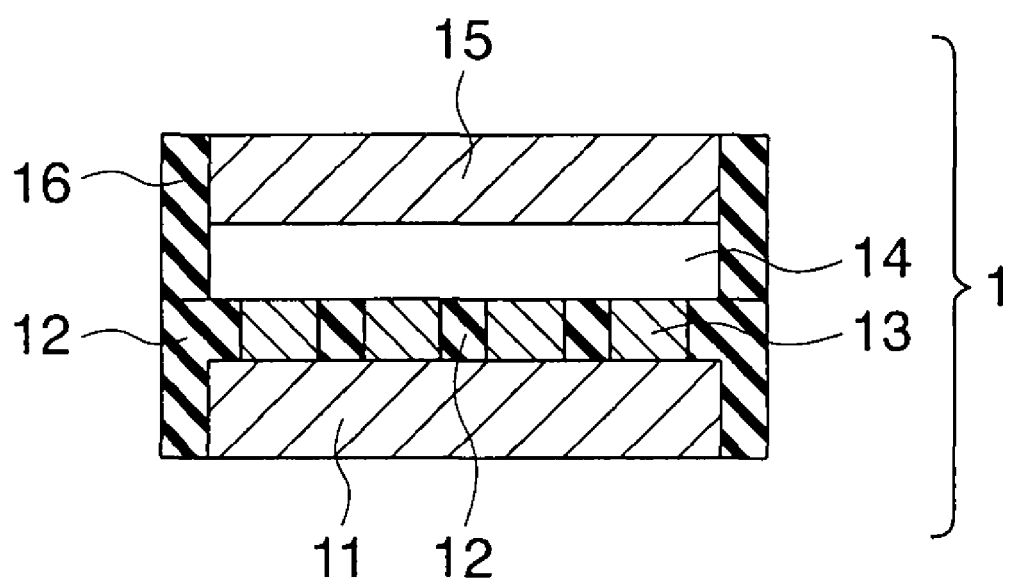
FIG. 4 is a sectional view showing a storage cell in a phase change memory according to a first modification of the first embodiment.

In the embodiment, it is understood from FIG. 1 that the recording layer 14 made from phase change material is formed so as to spread on all the storage cells uniformly. As shown in FIG. 4, when the recording layer 14 made from phase change material is worked to have the same shape as the lower electrode 11 or the upper electrode 15 and an insulating film 16 is arranged about the recording layer 14 made from phase change material, it is possible to reduce thermal influence among adjacent storage cells.

A preferable size and a preferable arrangement of the electrically conductive bodies 13 in the storage cell 1 according to the embodiment will be explained. When a voltage is applied between the upper and lower electrodes 11 and 15 in the storage cell 1 having electrically conductive bodies 13 as shown in FIGS. 1 and 2, a current flows from the lower electrode 11 to the recording layer 14 made from phase change material only through the electrically conductive bodies 13 in such a state that a ratio of a charge mobility in the electrically conductive bodies 13 to a diffusion coefficient of charges is sufficiently large. In other words, a current is localized. When the recording layer 14 is amorphous, since the ratio of the charge mobility to the diffusion coefficient becomes smaller than the case that the recording layer 14 is in a crystal phase, localization of a current is blocked further easily. In view of these circumstances, desirable size and arrangement of electrically conductive bodies 13 are determined in the following manner. An average value of the shortest distances between adjacent electrically conductive bodies 13 is represented as d, and an average value of distances between the centers of adjacent electrically conductive bodies 13 is represented as x, it is preferable that the ratio x/d is 1.5 or more. It is most preferable that the ratio x/d is 2 or more. When the ratio x/d is less than 1.5, since the adjacent electrically conductive bodies 13 are positioned near each other, an electric field is formed so as to cover a plurality of electrically conductive bodies 13 adjacent to one another so that localization of a current is blocked.

When the above-described desirable size and arrangement are adopted, current is localized and Joule heat occurs selectively along a current path. The Joule heat diffuses within the recording layer 14 made from phase change material with low heat conductivity, which results in heating of the whole recording layer 14 made from phase change material positioned within the superimposing region 17.

Such a fact that, when a portion of the phase change material is heated in this manner, phase change is caused over a region larger than a region where the phase change material has been heated is widely known as pulse modulation of recording light in a DVD (digital versatile disc). That is, when the phase change material records a non-crystallized mark along a track on a disc, total irradiation energy of recording light can be reduced and thermal influence to adjacent tracks can be avoided by recording amorphous mark using recording laser beam that is modulated between a maximum and a minimum powers at higher frequencies. In that case, an optimal mark shape can be obtained by adjusting the maximum value and the minimum value for the recording light power according to a film thickness of the phase change material layer and a track width.

Figure 2:
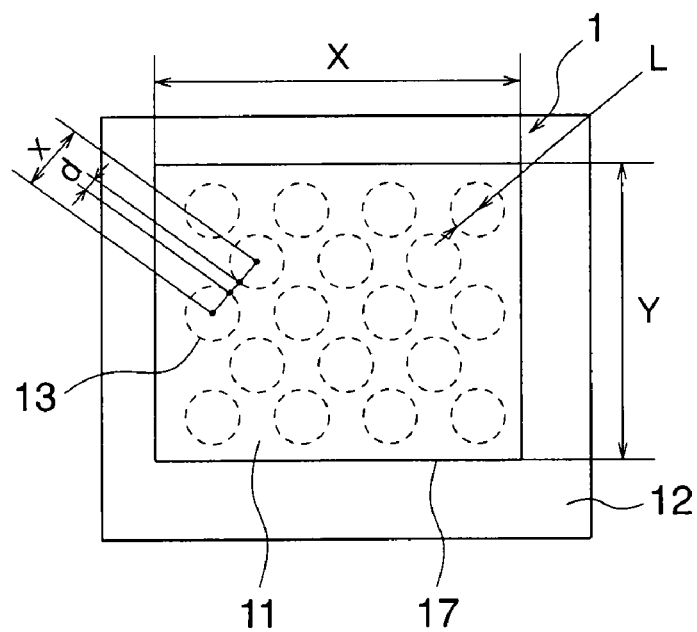
FIG. 2 is a plan view of the storage cell in the phase change memory according to the first embodiment, as viewed from a lower electrode side.
Figure 3:
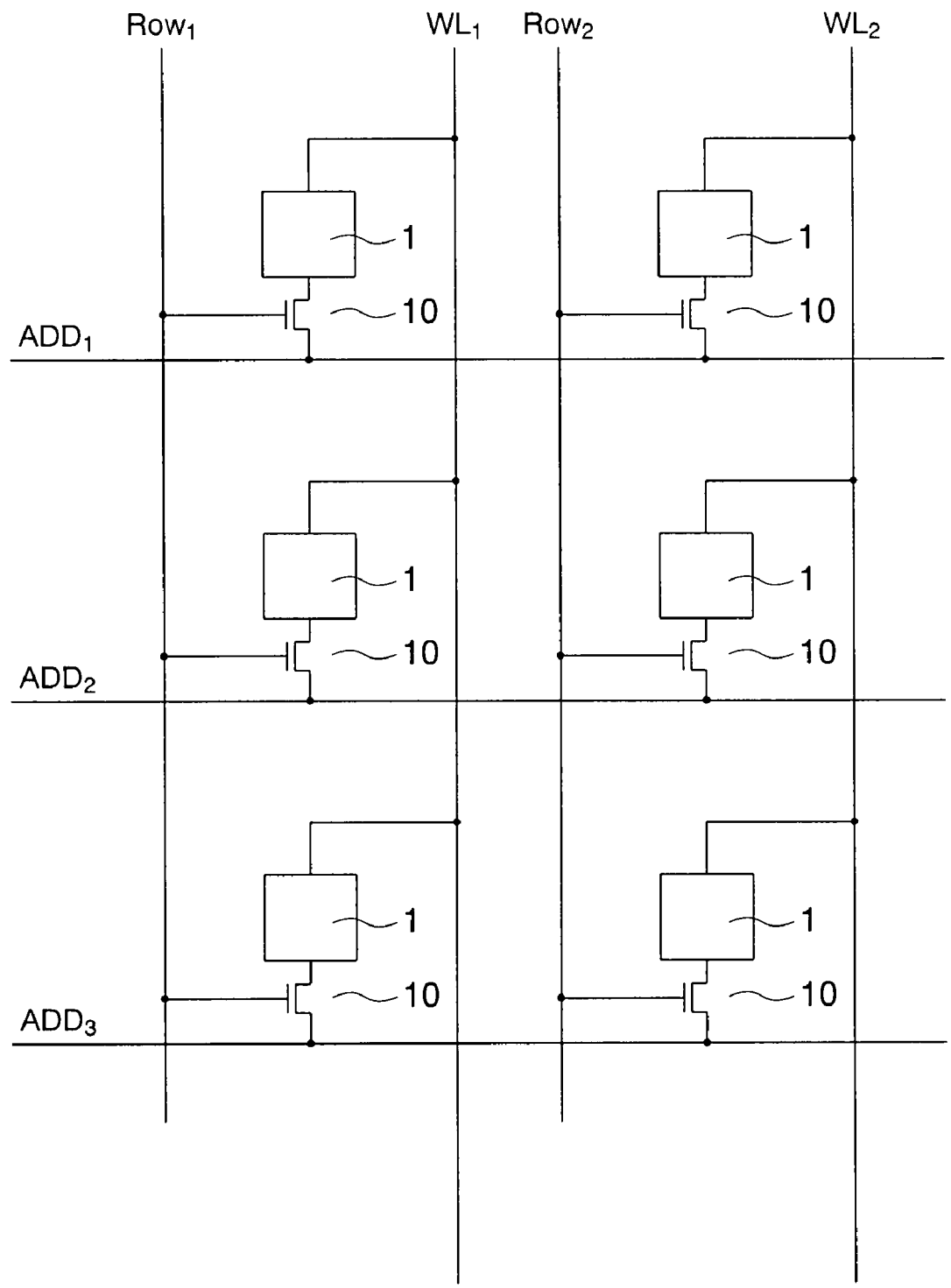
FIG. 3 is a circuit diagram showing an ordinary arrangement of a storage cell array in the phase change memory.

Accordingly, even in the phase change memory of the embodiment having the storage cell 1 shown in FIGS. 1 and 2, it is made possible to reduce a total amount of current and avoid thermal influence between adjacent cells by optimizing the size and the electric resistance of the electrically conductive body 13 according to the cell size of the storage cell 1, the film thickness of the recording layer 14 made from phase change material, and electrical characteristics of the phase change material for the recording layer 14. In that case, it is preferable that the electrically conductive bodies 13 have approximately equal sizes and they are spaced at approximately equal intervals by the insulating film 12 such that the phase change material layer 14 present in the superimposing region 17 between the upper and lower electrodes 11 and 15 causes phase change uniformly.

When the cell size of the storage cell 1 is reduced, it is effective to reduce the film thickness of the recording layer 14 in order to reduce current diffusion within the recording layer 14. However it is known that, when the recording layer 14 is thinned, since phase change to a crystal phase requires much time, crystallization of the recording layer becomes difficult. In such a case, it is effective to arrange a crystallization promoting layer so as to come in contact with the recording layer 14 in order to facilitate phase change to the crystal phase. This is because, when a layer made from phase change material and the crystallization promoting layer suitably combined are arranged, interface energy change due to phase change between the crystallization promoting layer and the phase change material becomes sufficiently large due to heating of the layer made from phase change material, so that non-uniform crystal nucleation becomes easy at the interface between the layer made from phase change material and the crystallization promoting layer. Accordingly, when the crystallization promoting layer made from material having such a crystallization promoting function is used instead of the insulating film 12 isolating the electrically conductive bodies 13, phase change to the crystal phase is facilitated. It goes without saying that the crystallization promoting layer has a resistance higher than that of the electrically conductive body 13.

Further, when mixture of two or more materials is used as the crystallization promoting layer, discrete interface energies occur at interface between the layer made from phase change material and the crystallization promoting layer, which results in facilitation of production of non-uniform crystal nucleation. Thus, it is preferable that the crystallization promoting layer is constituted of materials of at least two kinds. When even material such as GeN or SiC which is difficult to obtain a sufficiently small electric resistance when it is used alone as material for the crystallization promoting layer is used as mixture with material having an electric resistance larger than that of the former material, the electric resistance of the crystallization promoting layer can be increased. Thus, a layer made from mixture including two or more kinds of materials can also be used instead of the insulating film 12.

It is preferable that the lower electrode 11 is constituted by arranging high melting point metal such as Ta, Mo or W. A single layer constitution may be adopted for the upper electrode 15, but, for example, such a constitution may be adopted for the upper electrode 15 that a carbon film is formed on the recording layer 14 and such high melting point metal as Ta, Mo, or W is disposed on the carbon layer in order to prevent phase change material from diffusing. A thickness of each of the lower electrode 11 and the upper electrode 15 may be in a range of 100 nm or more to 200 nm or less, for example, while a thickness of the carbon film may be in a range of 5 nm or more to 10 nm or less.

Figure 5A:
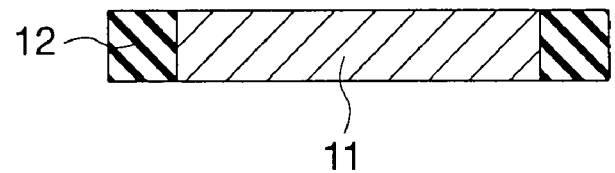
FIGS. 5A to 5D are sectional views showing manufacturing steps of the phase change memory according to the first embodiment.
Figure 5B:
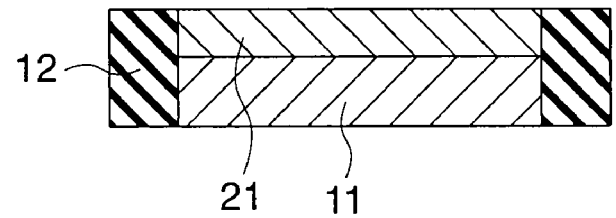

The electrically conductive body 13 is made from electrically conductive material. It is preferable that the electrically conductive body 13 is made from at least one selected from the group consisting of, for example, TiN, TiAlN, TiBN, TiSiN, TaN, TaAlN, TaBN, TaSiN, WN, WAlN, WBN, WSiN, ZrN, ZrAlN, ZrBN, ZrSiN, MoN, Al, Al—Cu, Al—Cu—Si, WSix, Ti, TiW, and Cu. Alternatively, the electrically conductive body 13 may be constituted from the same material as that for the lower electrode 11 such as Ta, Mo, or W. In that case, a formation process for the electrically conductive layer 21 shown in FIG. 5B described later may be omitted.

The phase change material for the recording layer 14 may be chalcogen compound such as Ge—Sb—Te, In—Sb—Te, Ag—In—Sb—Te, or Ge—Sn—Te. These materials are desirable for securing high speed switching performance, repetitive recording stability, and high reliability.

The insulating film 12 may be formed from any organic material or inorganic material, but when a function for promoting crystallization of the phase change material layer 14 is given to the insulating film 12, it is preferable that the material for the insulating film 12 is made from at least one selected from the group consisting of nitride of Ta, Nb, Al, La, Ce, Zr, Ca, Hf, Cr, Mg, Th, Ti, Sc, Be, V, B, In, Ba, Li, Ga, Mn, Si, or Ge, oxide of Ta, Si, Zr, Ti, Th, Li, Na, K, Ba, Zn, B, Sr, In, Sn, Hf, Cr, or Ce, or carbide of Ta, Ti, Al, Zr, Mn, Hf, Si, V, Cr, Be, Ce, Sm, Mo, or Nb. It is further preferable that nitride of Ge or Hf, oxide of Ta, Hf, Cr, Zr, or Ce, or carbide of Si is used, more preferably mixture of two or more materials selected from these materials is used. These materials are broadly used for a rewriting type light recording medium using phase change material for a recording film. Since rewriting durability is improved, it is further desirable that a film made from oxide of Hf, Cr, or Zr or a film containing one of these materials at 50 at. % or more is used as the insulating film 12.

Further, a protective layer (not shown) may be provided on the storage cell 1 in order to protect the storage cell 1 from moisture or the like. It is preferable that $Si_3N_4$, polyimide or the like is used as material for the protective layer.

X and Y in FIG. 2 denote lengths of two sides of the storage cell 1 shown in FIG. 2, and L denotes a diameter of the electrically conductive body 13 approximated to a circle. It is preferable that values of X and Y are in a range of 10 nm or more to 200 nm or less, respectively. It is further preferable that the values are in a range of 10 nm or more to 100 nm or less. When the values of X and Y are less than 10 nm, it becomes difficult to manufacture an electrically conductive body 13 with such a size or less. On the contrary, when the values exceed 200 nm, a current required for phase-changing the recording layer 14 made from phase change material increases excessively. On the other hand, it is preferable that L is in a range of 5 nm or more to 50 nm or less. When L is less than 5 nm, it is difficult to manufacture the electrically conductive body 13. On the contrary, when L becomes more than 50 nm, it is difficult to obtain such an advantage as reduction in current. However, these values can be selected properly according to phase change material for the recording layer 14 to be used or application voltage, or a voltage application time period such that the recording layer 14 made from phase change material is easily changeable to both of the crystal phase and the amorphous phase according to voltage application between the upper and lower electrodes 11 and 15.

(Manufacturing Method)

Next, a manufacturing method of a phase change memory according to the embodiment will be explained with reference to FIGS. 5A to 7B.

A phase change memory provided with the storage cells 1 having such a shape as shown in FIGS. 1 and 2 can be manufactured by, after first using an approach in an ordinary semiconductor process to produce address lines and transistors or diodes for cell selection, producing the storage cells 11 having such a shape as shown in FIGS. 1 and 2 on the transistors or diodes for cell selection.

An insulating film 12 is first formed to be higher than a height of a lower electrode 11 to be formed, and a portion where the lower electrode is to be formed is then removed by etching to form an opening (not shown). Lower electrode material film is embedded in the opening using, for example, anisotropy sputtering or CVD (chemical vapor deposition) process, thereby forming a lower electrode 11 (see FIG. 5A). The lower electrode material film formed on the insulating film 12 is removed by using CMP (chemical mechanical polishing) process or lift-off process.

Next, an insulator made from the same material as material for the insulating film 12 is deposited on the insulating film 12 and the lower electrode 11, and a portion of the insulator positioned on the lower electrode 11 is removed by etching so that an opening (not shown) through which the lower electrode 11 is exposed is formed at a bottom. Electrically conductive material 13 is similarly embedded in the opening using anisotropy sputtering or CVD process so that an electrically conductive layer 21 is formed (see FIG. 5B). Material for forming the electrically conductive bodies, which has been film-formed on the insulating film 12 is removed by CMP or lift-off process.

Next, a block copolymer layer is selectively formed on the electrically conductive layer 21 as a first resist layer. The block copolymer used here may be "di-block copolymer" of A-B type obtained by connection of two kinds of polymer chains A and B, for example. Alternatively, "tri-block copolymer" obtained by connection of three kinds of polymer chains A-B-C may be used.

A first method for selectively forming a block copolymer layer 22 on the electrically conductive layer 21 will be explained. Insulator made from the same material as that for the insulating film 12 is first deposited on the insulating film 12 and the electrically conductive layer 21, and a portion of the insulator positioned on the electrically conductive layer 21 is removed by etching so that an opening (not shown) through which the electrically conductive layer 21 is exposed is formed at a bottom. A block copolymer layer 22 is formed on the electrically conductive layer 21 (see FIG. 5C). Thereafter, as described later, a phase separation structure of the block copolymer 22 is oriented on the electrically conductive layer 21 by performing anneal process on the block copolymer so that periodic or cyclic structure having regular arrangement in a predetermined direction can be obtained by self-ordering. It is preferable that a depth of the electrically conductive layer 21 from an upper face of the insulating film 12 is smaller than a lattice spacing in the ordered structure of the block copolymer. This is because, when the depth is larger than the lattice spacing in the ordered structure, there is a possibility that a phase separation structure of the block copolymer layer 22 regularly stacked in a direction of film thickness too is formed. The most common structure of such a regularly arranged self-ordered structure is hexagonal lattice. The self-ordered structure is a cylinder structure or a lamellar structure. When these structures use such block copolymer as oriented perpendicularly to a film plane, the depth of the electrically conductive layer 21 from the upper face of the insulating film 12 may be larger than a lattice spacing in the ordered structure.

As a second method for selectively forming block copolymer layers 22 on the electrically conductive layer 21, a hydrophobicity processing may be performed on a surface of the insulating film 12 before block copolymer is formed. Since the block copolymer is rejected by a region of the surface of the insulating film 12 which has been subjected to the hydrophobicity processing, it is not formed on the region, but block copolymer can be deposited only on an upper portion of the electrically conductive layer 21 even in this case. Thereafter, the block copolymer forms a phase separation structure oriented according to a size of the electrically conductive layer by 21 performing an anneal processing, as described later. When hydrophobic material such as $SiO_2$ is used as material for the insulating film 12 and non-hydrophobic material is used as the insulator 13, silane coupler such as octadecyl-trimethyl-silane or hexamethyl-disalazan, or surface active agent such as alkanethiol can be used. Alternatively, such a constitution may be adopted that, after the insulating film 12 and the electrically conductive layer 21 are covered with a thin film made from hydrophobic material, resist application is conducted and hydrophobicity processing is performed on only a predetermined portion.

In either case, it is preferable that the electrically conductive layer 21 is wider than a lattice spacing or period between grids in the ordered structure of the block copolymer layer 22. This is for confining block copolymer on the electrically conductive layer 21 to promote occurrence of self-ordering on only the electrically conductive layer 21. It is preferable that one side of the electrically conductive layer 21 is set to be about several times a lattice spacing in a periodic arrangement in order to orient a phase separation structure on the electrically conductive layer 21 to form the periodic arrangement.

Incidentally, such a configuration may be adopted that concavo-convex pattern is formed on a surface of the electrically conductive layer 21 prior to formation of a block copolymer layer 22, and thereafter the block copolymer layer 22 is formed. In that case, an ordered structure of the block copolymer layers 22 formed on the electrically conductive layer 21 is oriented according to the feature pattern.

Figure 5C:
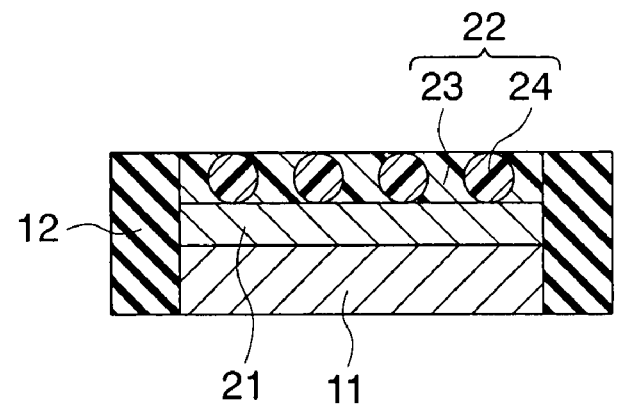

The block copolymer layer 22 is phase-separated to polymer phases 23 and polymer phases 24 according to anneal processing performed at a proper temperature to form an ordered structure. For example, as shown in FIG. 5C, a structure where the polymer phases 23 are arranged in a matrix form and the polymer phases 24 are regularly arranged in the polymer layers 23 in a two-dimensional manner. Shapes and sizes of the polymer phases 23 and 24 constituting such an ordered structure depend on lengths of polymer chains A, B, and C. Therefore, the sizes can be controlled to a fine size of, for example, about 15 nm or less.

Figure 5D:
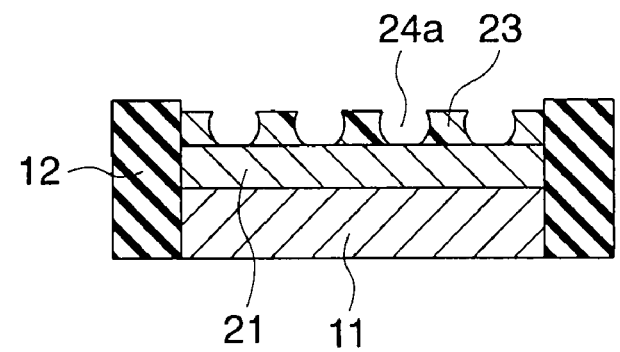

When the ordered structure of the block copolymer thus formed itself has a regularly arranged concavo-convex shape shown in FIG. 5D, a surface of the ordered structure of the block copolymer can be used as it is.

When the ordered structure of the block copolymer is flat, it is necessary to convert the phase separation structure in the block copolymer 22 to a concavo-convex structure. For example, a structure where recesses 24a having a semicircular curvature similar to the shape of the polymer phase 24 are regularly arranged, as shown in FIG. 5D, can be formed by selectively removing at least one kind of polymer phases 24.

When irradiation of energy beam such as plasma, light electron beam or heat is performed, block copolymers may be constituted of at least two kinds of polymer chains different in resistance to the energy beam or heat in order to selectively remove the polymer phases 24. For example, when a total number of atoms per monomer is represented as N, a number of carbon atoms per monomer is represented as Nc, and a number of oxygen atoms per monomer is represented as No, smaller value of N/(Nc−No) per monomer results in higher resistance to irradiation of various kinds of plasma irradiation. Therefore, a combination of at least two kinds of polymer chains noticeably different in plasma resistance may be adopted.

A combination of a polymer chain cured due to such as cross-linking reaction caused by energy beam irradiation and a polymer chain which is not cured by energy beam irradiation or decomposed thereby can be adopted. Further, for example, such a constitution can be adopted that hydrophilic property/hydrophobic property of polymer chains are changed considering affinity, so that cross-linking agent is segregated on a region of polymer chain with one property of the two properties. Therefore, a first resist layer (a polymer phase) 23 where recesses are regularly arranged can be formed by selectively removing at least one kinds of polymer phases 24 of the block copolymer films having the phase separation structure of a self-ordered pattern with a size of 15 nm or less (see FIG. 5D).

Figure 6A:
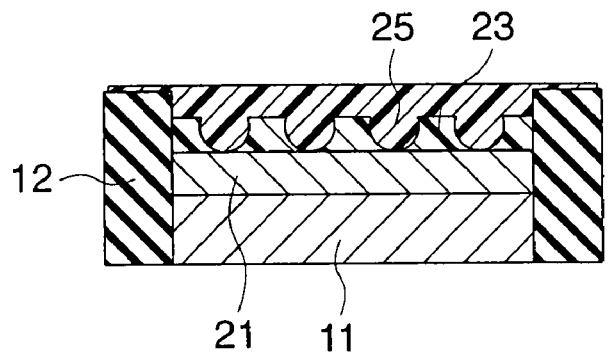
FIGS. 6A to 6D are sectional views showing manufacturing steps of the phase change memory according to the first embodiment.

Next, when an etching resistance of the first resist layer 23 is not high, a second resist layer 25 may be deposited on the first resist layer 23 for transferring the recess pattern of the resist layer 23 onto material with a high etching resistance, as shown in FIG. 6A. A mask pattern with a high etching resistance to plasma etching can be formed by using inorganic material such as metal, metal oxide, metal nitride, or carbide as material for the second resist layer 25. Low molecular organic material containing aromatic ring may be used. Further, material where metal is contained in low molecular organic material containing aromatic ring can be used. Polymer containing such metal as Si (silicon) such as polysilane or polysiloxane may be used.

When inorganic material or low molecular organic material is used as the material for the second resist layer 25, a vacuum deposition process can be used to cause the material to deposit on the first resist layer 23. It is possible to selectively cause nucleus growth in the recesses on the first resist layer 23 by heating sample or inorganic material during vapor deposition to selectively deposit the inorganic material in the recesses. Thus, it is possible to form the second resist layer 25 so as to fill in the recesses on the first resist layer 23. Alternatively, it is possible to embed the deposited second resist layer 25 in the recessed on the first resist layer 23 and planarize its surface.

Polymer material such as metal-containing polymer can be used as the material for the second resist layer 25. In that case, application of the second resist layer 25 on to the first resist layer 23 can be performed by dissolving material for the second resist layer 25 in proper solvent to perform spinning coat. The second resist layer 25 made form polymer material just after spinning-coated is planarized so as to fill in the recesses on the first resist layer 23 due to surface tension. In some cases, for increasing an effect of surface tension, hydrophobicity is applied on a surface of the first resist layer 23 in order to perform spinning coat on the second resist layer 25. It is possible to simply apply hydrophobicity to the surface of the fist resist layer 23 by exposing the surface to plasma of carbon fluoride. After the polymer film is spin-coated as the second resist layer 25, it is possible to deposit polymer material in only the recesses or promote planarizing by performing anneal processing. Now, the second resist layer 25 may be formed to fill in the recesses on the first resist layer 23 completely and cover a flat portion of the first resist layer 23, as shown in FIG. 6A, or it is formed to fill in only the recesses on the first resist layer 23.

Figure 6B:
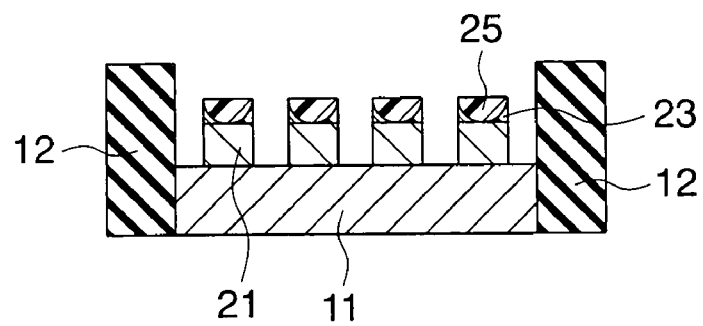
Figure 6C:
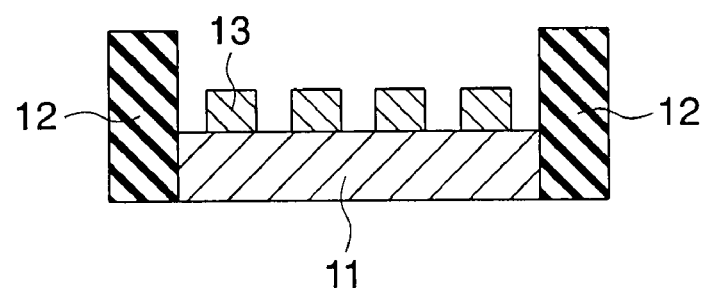

Next, electrically conductive bodies 13 are formed by using the mask patterns 23 and 25 thus formed, performing etching process directly on the electrically conductive layer 21 and removing the remaining resist layer using ashing or the like (see FIG. 6C).

Incidentally, when the second resist layer 25 is not provided, since the electrically conductive layer 21 is etched using the first resist layer 23 as the mask, it is necessary to select material for the first resist layer 23 (polymer phase 23) and an etching process for performing the etching.

When the second resist layer 25 is provided, since the first resist layer 23 is etched using the second resist layer 25 as the mask, and the electrically conductive layer under the first resist layer 23 is further etched, it is necessary to select material for the second resist layer 25 and an etching process for performing the etchings. If an etching selection ratio with the first resist layer 23 can be secured, the process for etching the first resist layer 23 and the process for etching the electrically conductive layer 21 are not required to be identical to each other. For example, when dry etching is used, etching gas used for etching the first resist layer 23 and etching gas for etching the electrically conductive layer 21 may be different from each other.

For example, after the polymer chain region (the polymer phase 23) where the block copolymer has not been removed is etched by performing RIE (reactive ion etching) process before etching the electrically conductive layer 21, patterning with a high aspect ratio can be performed by applying a proper process on the electrically conductive layer 21.

Figure 6D:
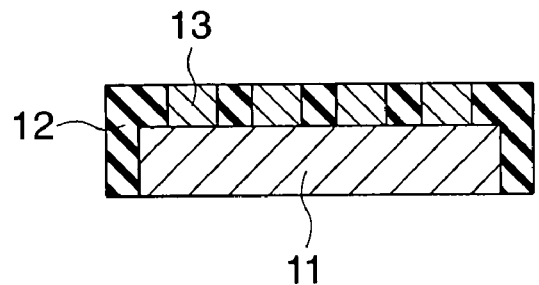

By, after forming the electrically conductive bodies 13 in this manner, depositing an insulator made from the same material as the material for the insulating film 12 on a whole surface and performing planarizing process on the insulator using, for example, CMP until the electrically conductive bodies 13 are exposed, electrically conductive bodies 13 which are arranged regularly and have substantially the same shape as the insulating films 12 can be obtained, as shown in FIG. 6D.

Figure 7A:
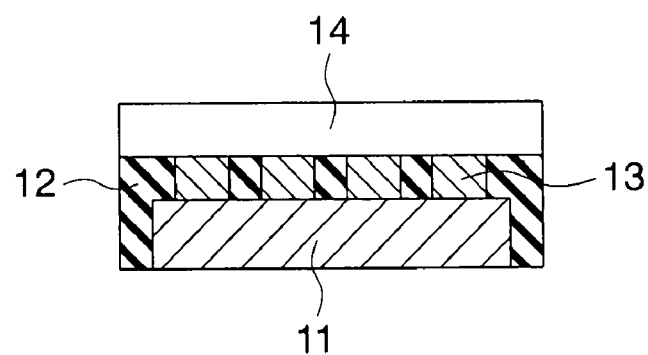
FIGS. 7A to 7B are sectional views showing manufacturing steps of the phase change memory according to the first embodiment.

Next, a recording layer 14 made from phase change material is formed (see FIG. 7A). Some examples of a formation process for the recording layer 14 made from phase change material can be shown.

As one example, a phase change material layer 14 is formed uniformly, as shown in FIG. 7A. In another example, insulator made from the same material as the material for the insulating film 12 is uniformly deposited in advance up to a height of the recording layer 14 made from phase change material to be formed, an insulating portion corresponding to the recording layer 14 made from phase change material is removed, so that an opening (not shown) through which the electrically conductive bodies 13 and the insulating films 12 are exposed is formed on a bottom face. The recording layer 14 made from phase change material is formed by embedding the phase change material in the opening by anisotropy sputtering or CVD process. Phase change material film formed on the insulating film 12 positioned on a side of the recording layer 14 is removed by CMP or lift-off process. In that case, a structure shown in FIG. 4 is obtained so that thermal influence between adjacent storage cells can be reduced.

In still another method, after the recording layer 14 made from phase change material is formed on the lower electrode 11, steps shown in FIG. 5B to FIG. 6D may be performed. In this case, the recording layer 14 made from phase change material is formed between the lower electrode 11 and the electrically conductive bodies 13.

Figure 7B:
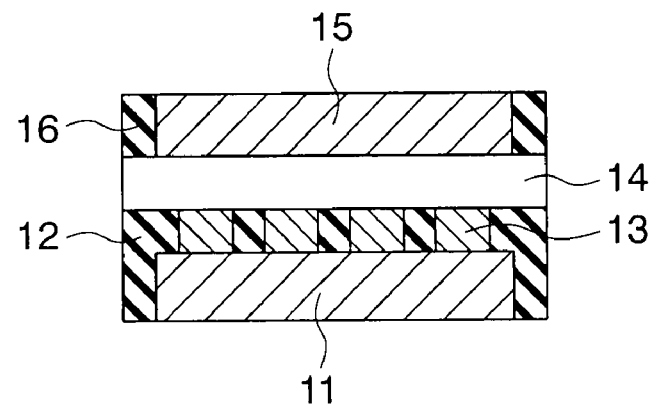

Next, an upper electrode 15 is formed on the recording layer 14 (see FIG. 7B). In formation of the upper electrode 15, after insulator is deposited on the recording layer 14 made from phase change material, an insulating film 16 having an opening (not shown) through which the recording layer 14 is exposed is formed on a bottom thereof by patterning the insulator. The upper electrode 15 is formed by filling material for the upper electrode into the opening of the insulating film 16. Thereafter, a word line extending in a direction different from that of the address line and the upper electrode 15 are connected to each other.

As explained above, in the embodiment, after the block copolymer layer is formed in the concavo-convex pattern corresponding to the shape of the lower electrode 11, a self-ordered structure is formed by performing phase separation to block copolymer and a mask is formed by selectively removing one polymer phase. An ordered structure of the phase-separated block copolymer can be controlled arbitrarily by adjusting materials for the polymer chains or blend balance thereof. As a result, an ordered structure with a fine size of 15 nm or less can be formed in a self-organizing manner by controlling the shape of the lower electrode, and patterning of the electrically conductive bodies 13 reflecting this arrangement can be implemented reliably and easily. Accordingly, properties of the storage cells can be controlled reliably.

Figure 8:
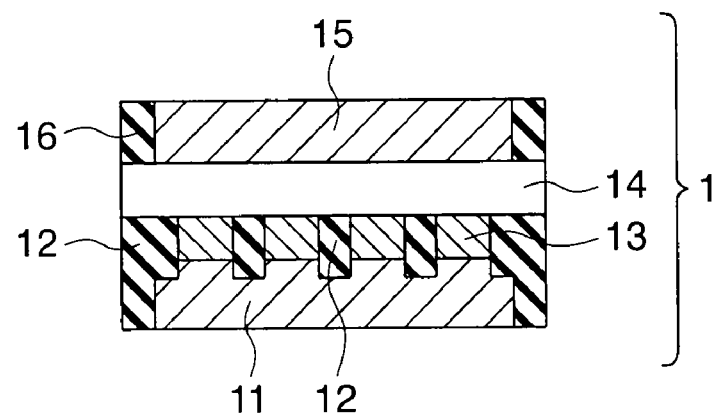
FIG. 8 is a sectional view showing a storage cell in a phase change memory according to a second modification of the first embodiment.

According to the embodiment, the lower electrode 11 can be etched simultaneously when etching process is performed on the electrically conductive layers 21 shown in FIG. 6B. When the cell size of the storage cell 1 is small or the diameter L of the electrically conductive body 13 is small, such a phenomenon may occur that a current becomes easy to flow from the lower electrode 11 to the electrically conductive bodies 13 in a case that the lower electrode 11 is formed to have substantially the same shape as that of the electrically conductive body 13, as compared with a case that such formation is not made. This is similar to, for example, such a phenomenon that, in a near-field light probe, when a taper angle is provided on a probe portion, output from the probe is increased. Accordingly, when etching process to the lower electrode 11 is performed simultaneously with etching process on the electrically conductive layer 21, the storage cell 1 has such a structure as shown in FIG. 8. In a phase change memory provided with a storage cell 1 having such a structure, it is made possible to cause a current to flow between the upper and lower electrodes efficiently.

Now, according to the embodiment, when the second resist layer 25 is used, it is further possible to control a pattern size of the electrically conductive bodies 13. That is, a width of a pattern for the electrically conductive bodies 13 to be formed finally can be changed by controlling process conditions. There are two kinds of methods for changing the pattern width. One method is a method for adjusting a deposition amount of the second resist layer 25.

Figure 9A:
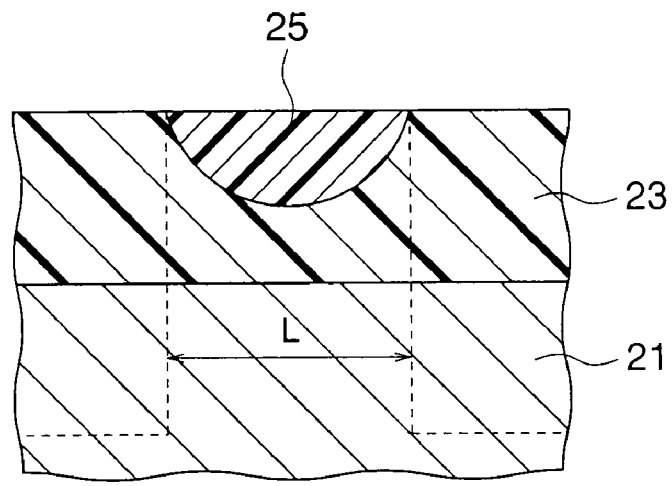
FIGS. 9A and 9B are views for explaining a first specific example of a process for changing a width of an electrically conductive body of the phase change memory according to the first embodiment.
Figure 9B:
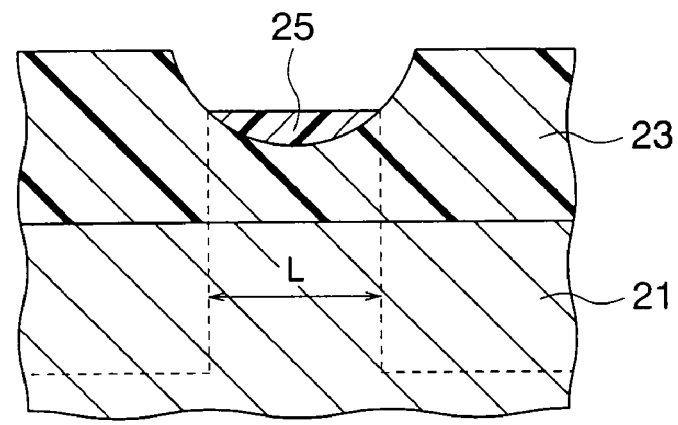

FIGS. 9A and 9B are conceptual views for explaining a method for changing an area of a region utilized as a mask arbitrarily by adjusting the deposition amount of the second resist layer 25. As shown in FIG. 9A, for example, the entire recess is masked by depositing the second resist layer 25 to fill in the recess on the first resist layer 23. Accordingly, a size L of the electrically conductive body 13 formed by etching the electrically conductive layer 21 becomes substantially the same as an outer edge size of the recess, as shown in FIG. 9A. On the other hand, as shown in FIG. 9B, since the recess has a curvature of a semi-circular shape, when the deposition amount of the second resist layer 25 is decreased, a portion covered with the second resist layer 25 becomes small, and an area of a portion serving as a mask becomes small, so that the size L of the electrically conductive body 13 to be obtained finally can be reduced. This is achieved by utilizing such a fact that the recess has been formed in a curved shape.

According to the embodiment, by adjusting the deposition amount of the second resist layer 25 in this manner, it is made possible to change a mask size so that the pattern size for the electrically conductive bodies 13 can be controlled. Incidentally, in that case, by using an etching process where an etching rate of the second resist layer 25 to those of the electrically conductive bodies 13 and the first resist layer 23 is sufficiently low, precise patterning corresponding to the second resist layer 25 can be achieved.

Another method for adjusting the size of the electrically conductive bodies 13 is a method for over-etching the second resist layer 25 serving as a mask.

Figure 10A:
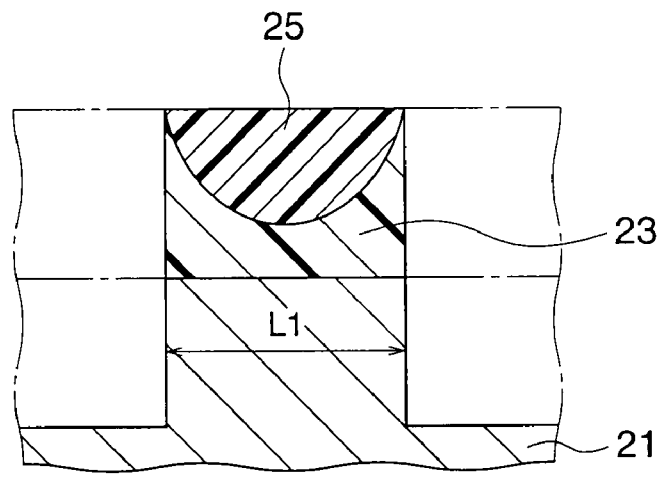
FIGS. 10A and 10B are views for explaining a second specific example of a process for changing a width of an electrically conductive body of the phase change memory according to the first embodiment.
Figure 10B:
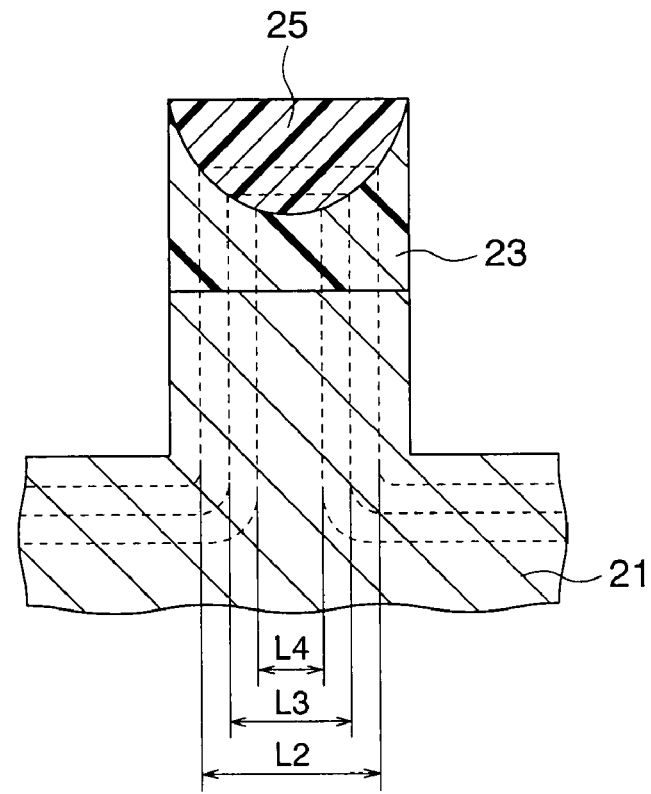

FIGS. 10A and 10B are conceptual views for explaining such a fact that the size of the electrically conductive bodies 13 is changed by over-etching the second resist layer 25.

As shown in FIG. 10A, when material for the second resist layer 25 is deposited so as to fill the recess of the resist layer 23 and etching is performed with a high selection ratio utilizing the second resist layer 25 as a mask, the size L of the electrically conductive body 13 is coincident with a size between opposed outer edges of the second resist layer 25, i.e., opposed outer edges of the recess. Incidentally, in order to perform accurate etching matching with the outer edge of the mask in this manner, it is preferable that a method having high anisotropy and having suppressed side etching is used as the etching method.

On the other hand, when over-etching is performed under such a condition that the second resist layer 25 is also etched to some extent, as shown in FIG. 10B, the second resist layer 25 serving as the mask gradually disappears from thin outer edge portions thereof. The first resist layer 23 and the electrically conductive layer 21 positioned below the second resist layer 25 are etched. As a result, the size of the electrically conductive layer 21 can be properly reduced to either one of sizes L2 to L4 according to an over-etching amount. That is, according to the embodiment, the size of the electrically conductive body 13 can be controlled by over-etching the second resist layer 25 properly. An approximately cylindrical pillar-shaped pattern formed by the over-etching has a skirt portion or base whose pattern width gradually changes toward a lower end thereof. The skirt portion is formed according to continuous advance of etching from the outside according to the over-etching of the second resist layer 25. When such a skirt portion which gradually becomes thick is formed toward the lower end of the electrically conductive body 13 in this manner, current flow from the lower electrode 11 to the electrically conductive body 13 is not only promoted but also the pillar is prevented from being broken at its proximal or root portion. Such an advantage is especially noticeable when etching is performed at a high aspect ratio.

In the size adjusting method using the over-etching, it is preferable that the method for etching the first resist layer 23 and the method for etching the electrically conductive layer 21 are different from each other. That is, the size can be controlled independently in a step for etching the first resist layer 23. As shown in FIG. 6B, when such a skirt portion is formed to reach the lower electrode 11, further effective current flow from the lower electrode 11 to the electrically conductive body 13 is made possible, as compared with the case shown in FIG. 8. Incidentally, the storage cell 1 that both of the electrically conductive body 13 and the lower electrode 11 have such shapes that their diameters increase from the recording layer 14 made from phase change material is employed, but, even if such a constitution is employed that only one of the electrically conductive body 13 and the lower electrode 11 has such a shape that its diameter increases from the recording layer 14 made from phase change material toward the lower electrode 11 is employed, a similar advantage can be obtained. The electrically conductive body 13 and the lower electrode 11 may be made from the same material.

When an initial anneal process is applied to a phase change memory having storage cells 1 manufactured by such a manufacturing process, it can be performed in the following manner. When the initial anneal process is performed, the recording layer 14 made from phase change material is changed to a crystal phase which is a lower resistance state and a cell having a resistance value outside a reference value can be removed as a defective cell. When a recording layer 14 made from even phase change material is formed over all the storage cells, it is made possible to determine a phase change region by the initial annealing process.

When the recording layer 14 made from phase change material is formed in a shape similar to that of the lower electrode 11 or the upper electrode 15, the recording layer 14 made from phase change material can be changed to a crystal phase by, after manufacturing a storage cell 1, heating the entire storage cell 1 up to a temperature at which crystallization occurs in the phase change material layer 14. In that case, the initial annealing process may be performed while causing a current to flow between the lower electrode 11 and the upper electrode 15.

Even when the recording layer 14 made from phase change material is not formed in a shape similar to that of the lower electrode 11 or the upper electrode 15 and it is an even layer, the initial annealing process can be performed by a similar process. In that case, when crystallization promoting material for promoting crystallization of the recording layer 14 made from phase change material is used as the material for the insulating film 12, a crystallization promoting layer is formed at an upper portion of the lower electrode 11 so as to come in contact with the recording layer 14 made from phase change material, so that only a portion of the phase change material positioned on the lower electrode 11 can be initially crystallized by adjusting the initial annealing conditions. Since only a region in which the crystallization occurs at the initial annealing time serves as the phase change region at a recording or reproducing time of information, so that the phase change region can be determined by the initial annealing process.

As explained above, according to the embodiment, even if the size of the storage cell becomes small, the electrically conductive bodies 13 have approximately equal shapes, and they are spaced and arranged at equal intervals by the insulating film 12, phase change occurs evenly in the phase change material layer 14. Therefore, properties of the respective storage cells can be made approximately even and an amount of current required for performing phase change can be reduced sufficiently.

According to the manufacturing method for manufacturing a phase change memory according to the embodiment, it is made possible to form an electrically conductive body pattern corresponding to an ordered structure where first polymer phases and second polymer phases have been approximately regularly arranged, so that electrically conductive bodies which are regularly arranged and have substantially equal shapes can be produced easily. As a result, a phase change memory where storage cells having even performance have been arranged can be manufactured inexpensively.

Second Embodiment

Figure 11:
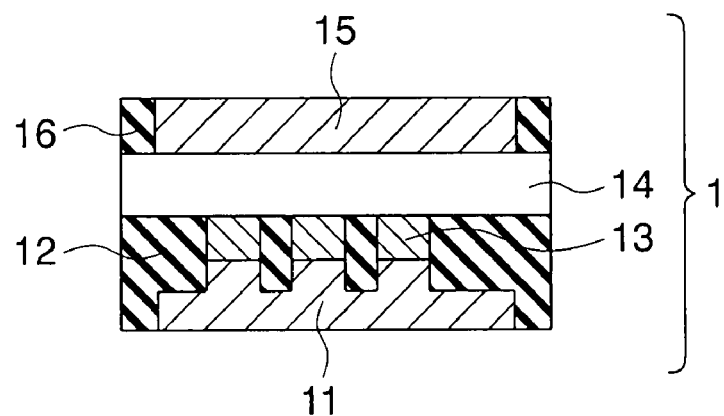
FIG. 11 is a sectional view showing a storage cell in a phase change memory according to a second embodiment of the present invention.

Next, a phase change memory according to a second embodiment of the present invention will be explained with reference to FIGS. 11 and 12. FIG. 11 is a sectional view of a phase change memory according to a second embodiment, and FIG. 12 is a bottom view of the phase change memory according to the second embodiment, as viewed from the lower electrode side.

The phase change memory according to this embodiment and the phase change memory according to the first embodiment are different in that electrically conductive bodies 13 having approximately equal shapes are not formed over an entire region of a superimposed region 17 between the upper and the lower electrodes but only inside an electrically conductive body region 18 smaller than the superimposed region 17.

Figure 12:
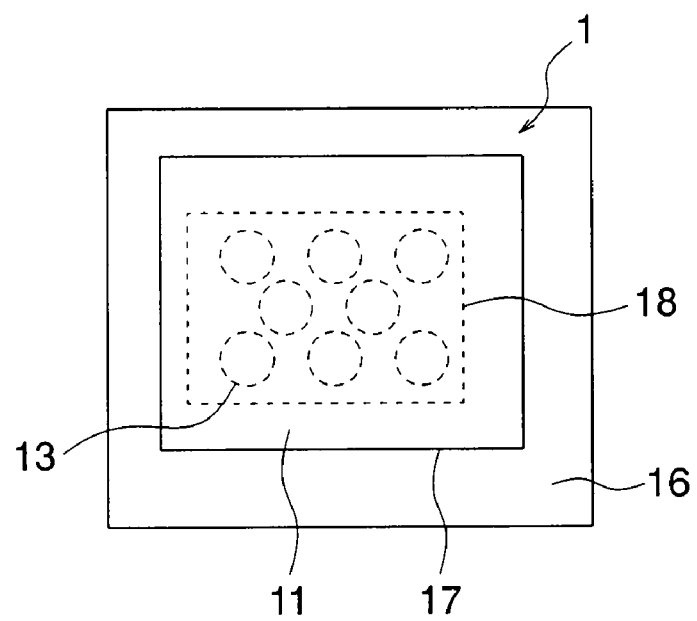
FIG. 12 is a plan view of the storage cell in the phase change memory according to the second embodiment, as viewed from a lower electrode side.

Information can be recorded in and reproduced from the phase change memory having the storage cells shown in FIGS. 11 and 12 like the phase change memory shown in FIG. 1. That is, phase change is caused in phase change material by applying a voltage between the lower electrode 11 and the upper electrode 15 to cause a current to flow from the lower electrode 11 to the upper electrode 15 via the electrically conductive bodies 13 and the recording layer 14 made from phase change material and to heat the recording layer 14 made from phase change material. Even in that case, since much current flows at portions of the recording layer 14 made from phase change material corresponding to the electrically conductive bodies 13, as explained regarding FIG. 1, much Joule heat is generated.

Accordingly, when phase change of the phase change material layer 14 is caused in the storage cell according to the embodiment shown in FIGS. 11 and 12, it is made possible to cause phase change in only a region having smaller section area than that in the case that phase change of the phase change material layer 14 is caused in the storage cell shown in FIG. 1. Therefore, since a region where phase change occurs can be reduced without changing an electrode size, it is possible to reduce an amount of current required for phase change. As a result, breaking or heat generation of an electrode due to excessive application of current per unit area thereto can be suppressed. When the electrode size is reduced, it becomes difficult to position the electrode to other elements. Therefore, it is meaningful in view of manufacturing that a region where phase change occurs can be reduced without reducing the electrode size.

Even in the phase change memory according to the second embodiment having the storage cells 1 shown in FIGS. 11 and 12, a shape, a size and an electric resistance of the electrically conductive body 13 can be optimized according to phase change material used for the recording layer 14, an application voltage or a voltage application time period such that the recording layer 14 made from phase change material can easily change to both of a crystal phase and an amorphous phase according to voltage application between the upper and lower electrodes.

(Manufacturing Method)

Next, a method for manufacturing a phase change memory according to the second embodiment having the storage cells 1 shown in FIGS. 11 and 12 will be explained with reference to FIGS. 13A to 15C. FIGS. 13A to 15C are sectional views of steps showing the manufacturing method according to the embodiment. The manufacturing method according to the embodiment is for forming a pattern on an electrically conductive layer 21 via a transfer layer.

An insulating layer 12 is first formed so as to become higher than a height of a lower electrode 11 to be formed and thereafter a portion where a lower electrode is to be formed is removed by etching to form an opening (not shown). A lower electrode 11 is formed by embedding material for a lower electrode film in the opening using, for example, anisotropy sputtering or CVD process (see FIG. 13A). The material for the lower electrode film formed on the insulator 12 is removed by applying CMP (chemical mechanical polishing) process or lift-off process. Subsequently, insulating material made from the same material as that for the insulating film 12 is deposited on the insulator 12 and the lower electrode 11 and a portion of the insulator positioned on the lower electrode 11 is removed by etching so that an opening (not shown) through which the lower electrode 11 is exposed is formed at the bottom. An electrically conductive layer 21 is formed by embedding material for forming the electrically conductive bodies 13 in the opening using anisotropy sputtering or CVD process (see FIG. 13A). The material for forming the electrically conductive bodies, which has been formed on the insulating film 12, is removed by CMP or lift-off process.

Figure 13A:
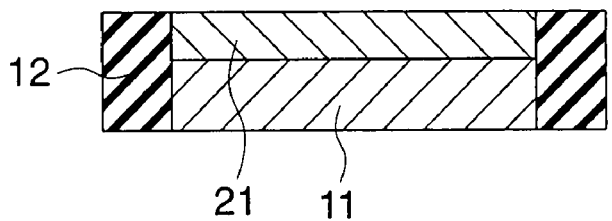
FIGS. 13A to 13D are sectional views showing manufacturing steps of the phase change memory according to the second embodiment.
Figure 13B:
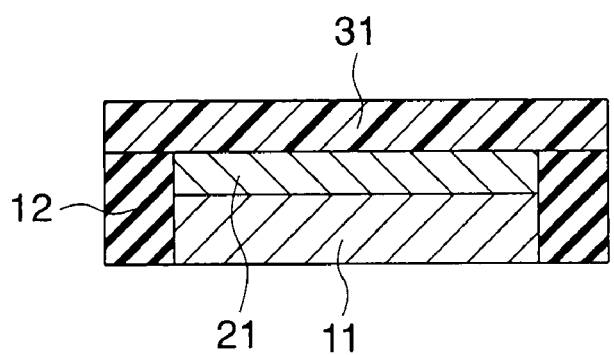
Figure 13C:
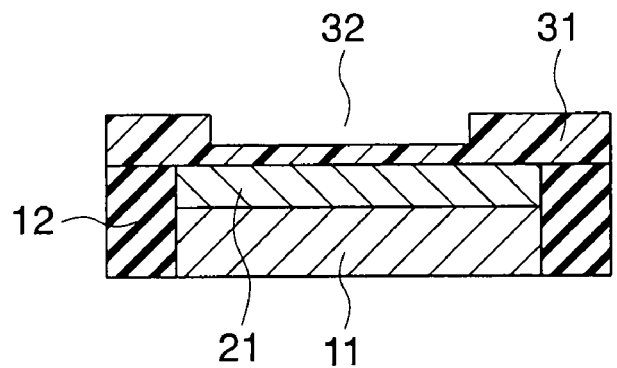

Next, as shown in FIG. 13B, after application of a transfer layer 31 made from carbon-based organic polymer material is performed, a recess 32 is formed in the transfer layer 32, as shown in FIG. 13C. The recess 32 may be formed by further applying another resist on the transfer layer 31 and utilizing lithography process. Alternatively, by utilizing such a fact that the carbon-based organic polymer material is soft, a feature pattern of a predetermined original stamper disc is directly transferred to the material utilizing "nano-imprint process".

Incidentally, the transfer layer 31 is cured before or after forming the recess 32. The curing is important for preventing the pattern formed on the transfer layer 31 from being destroyed by solvent of the first resist layer formed thereon, namely, block copolymer or annealing process applied to obtain a self-ordered structure. Curing of the transfer layer 31 is performed by light irradiation or heating. Photo-curing resin may be polystyrene, polybutadiene, polyisoprene, novolac resin, or diazo-series resin, or the like. The heat-curing resin may be polyacrylonitrile derivative, polyamic acid, polyimide, polyaniline derivative, polybutadiene, polyisoprene, novolac resin, or the like. For curing polymer chains more efficiently, it is useful to add radical generating agent such as organic peroxide or cross-linking agent to promote cross-linking reaction.

When curing process is performed after forming the recess 32, pattern collapsing may occur during heat curing. Therefore, it is preferable that the photo-curing is applied. When both the photo-curing and the heat-curing are utilized, the curing reaction is further promoted, and heat resistance property and solvent resistance property can be elevated. When direct transfer of a pattern on an original stamper disk is performed utilizing nano-imprint process, the transfer layer 31 may be cured by heating a substrate during pressure-contacting or performing light irradiation.

Figure 13D:
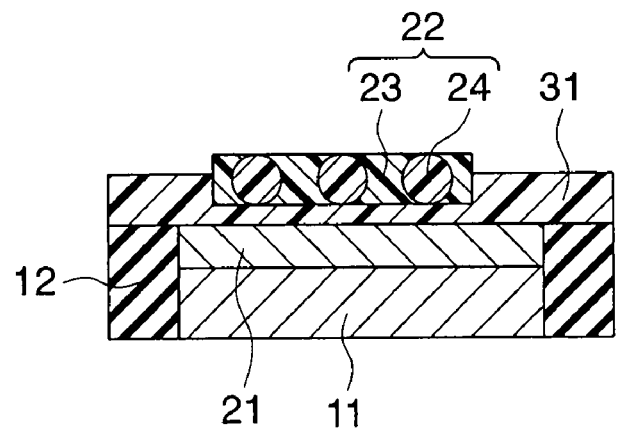

Next, block copolymer 22 is applied in the recess 32 by a spin coat process, and anneal processing is performed at a proper temperature, so that the block copolymer 22 is phase-separated into polymer phases 23 and polymer phases 24, thereby achieving a self-ordering (see FIG. 13D).

Figure 14A:
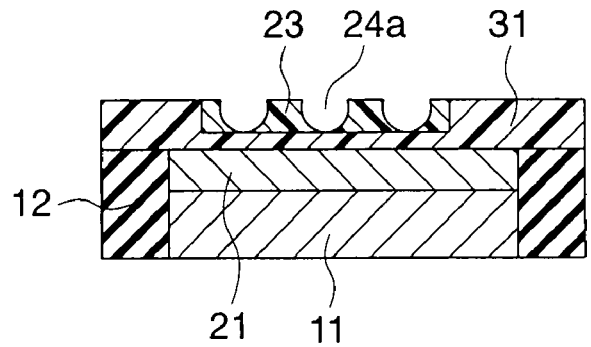
FIGS. 14A to 14D are sectional views showing manufacturing steps of the phase change memory according to the second embodiment.

Next, as shown in FIG. 14A, the polymer phases 24 are selectively removed from the phase-separated block copolymer 22 by such means as energy beam irradiation, as described above, so that a first resist layer 23 comprising polymer phase with recesses 24a regularly arranged is formed.

A second resist layer 25 is formed on the first resist layer 23 according to need (see FIG. 14B), and a pattern is transferred on the transfer layer 31 utilizing the resist layers as masks in the same manner as the first embodiment.

It is preferable that material with high resistance to oxygen plasma is used as material for the second resist layer 25. For example, inorganic material such as metal, metal oxide, metal nitride, carbide, or the like, low-molecular-weight organic material containing aromatic ring or material where metal is contained in low-molecular-weight organic material containing aromatic ring, or polymer containing such metal as Si (silicon) such as polysilane or polysiloxane may be used as the material for the second resist layer 25. Since etching resistances of these materials to oxygen plasma are considerably higher than that of carbon-based organic polymer material, a pattern transfer to the transfer layer 31 can be realized at a high aspect ratio.

Figure 14B:
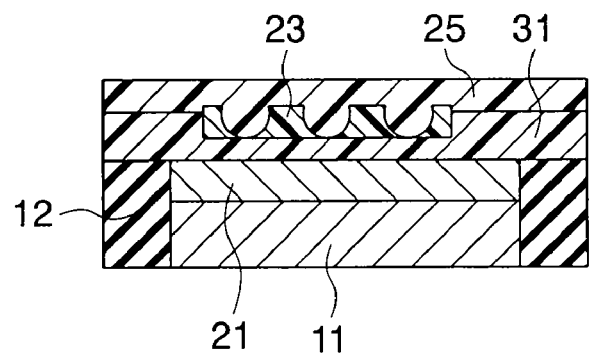
Figure 14C:
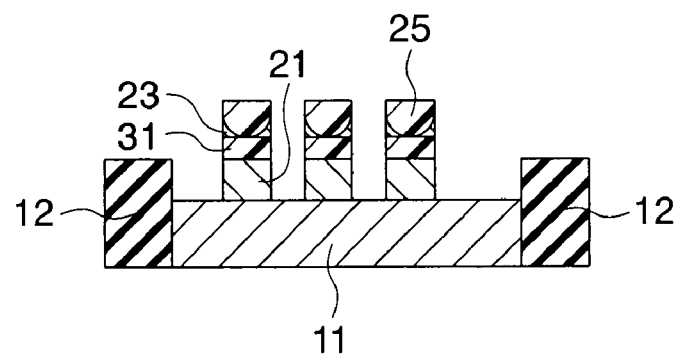
Figure 14D:
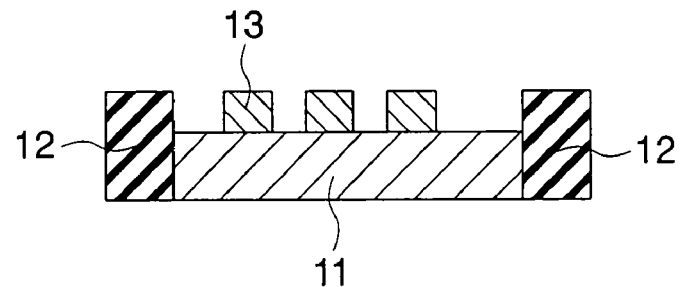

Next, the electrically conductive layer 21 is patterned using, for example, RIE (reactive ion etching) process (see FIG. 14C). Subsequently, the patterned electrically conductive layer is left as the electrically conductive bodies 13 by removing the transfer layer 31 (see FIG. 14D).

Figure 15A:
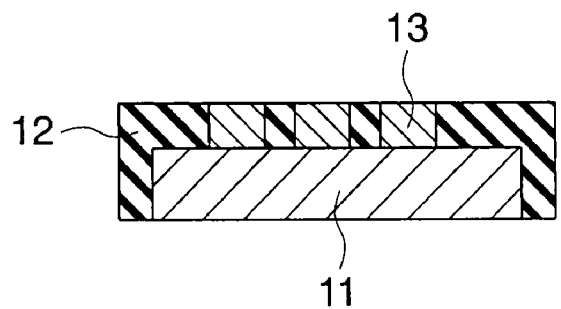
FIGS. 15A to 15C are sectional views showing manufacturing steps of the phase change memory according to the second embodiment.
Figure 15B:
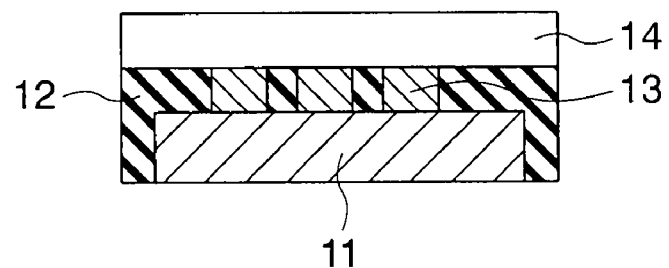
Figure 15C:
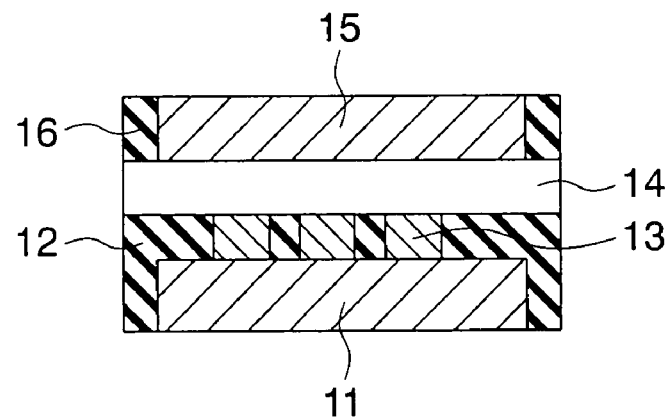
Figure 16:
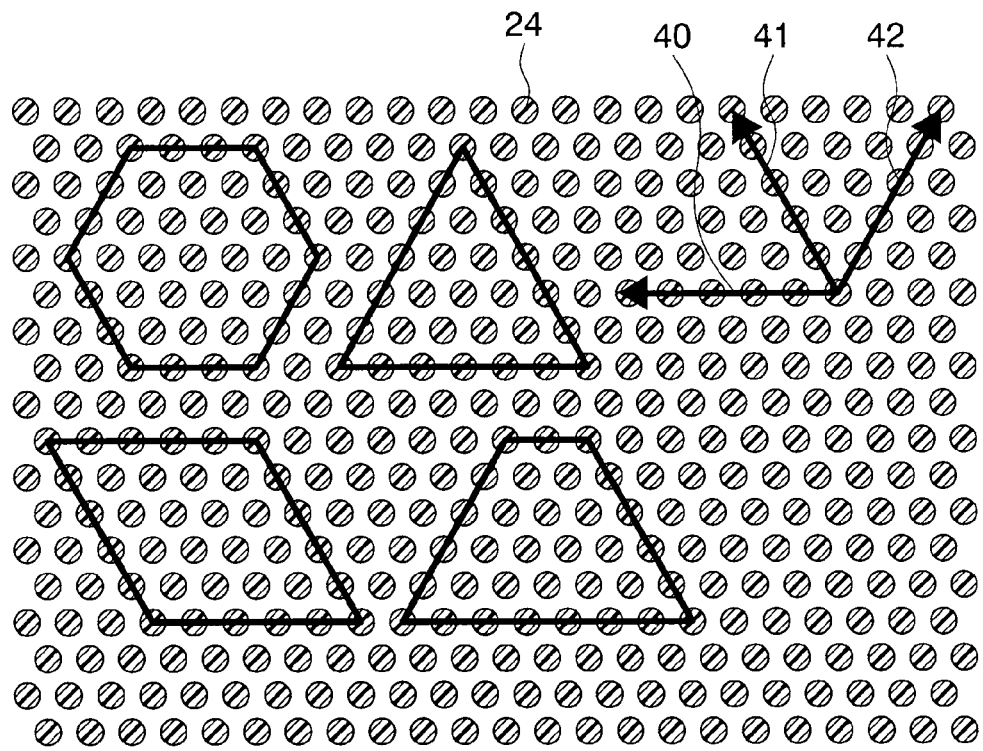
FIG. 16 is a view for explaining a shape of a recessed portion necessary for a block copolymer in the second embodiment to form a hexagonal lattice structure.

Next, insulator made from the same material as that for the insulating film 12 is formed so as to cover the electrically conductive bodies 13, and the insulator is processed until surfaces of the electrically conductive bodies 13 are exposed, so that the electrically conductive bodies 13 with approximately the same shape arranged substantially regularly and the insulating film 12 can be obtained, as shown in FIG. 15A.

Subsequently, a storage layer 14 made from phase change material is formed (see FIG. 15B), and an upper electrode 15 and an insulating film 16 are then formed (see FIG. 15C) like the first embodiment.

Even in the embodiment, the structure shown in FIG. 4, obtained by processing the storage layer 14 made from phase change material to form an insulating film 16 around the storage layer 14 according to needs may be adopted.

As explained in the first embodiment, a size of a pattern to be transferred on the transfer layer 31 is adjusted by adjusting an application amount of the second resist layer 25 or over-etching the second resist layer 25, so that the size of the electrically conductive bodies 13 can be controlled.

In the embodiment, it is preferable that the recess 32 is wider than a lattice spacing, or periodic interval, in the ordered structure of the block copolymer. This is for promoting such a phenomenon that block copolymer is confined in the recess 32 and the self-ordering occurs only on the recess 32. It is preferable that one side of the recess 32 is set to several times a lattice spacing in the periodic arrangement in order to orient a phase separation structure on the electrically conductive layer 21 to form a periodic arrangement. Typically, it is preferable that one side of the recess 32 is in a range of 0.25 time or more to 0.9 time or less one side of the lower electrode 11. It is further preferable that the one side of the recess 32 is in a range of 0.3 time or more to 0.6 time or less the one side of the lower electrode 11. When the one side of the recess 32 is excessively small relative to the lower electrode, it becomes difficult to produce a sufficient number of electrically conductive bodies 13. On the other hand, when the one side of the recess 32 is more than 0.9 time the one side of the lower electrode 11, it becomes difficult to obtain such an advantage as current reduction, and high positioning accuracy is further required when the recess 32 is formed utilizing imprint process or the like. In other words, by setting the one side of the recess 32 to be smaller than that of the lower electrode 11, such an advantage can be obtained that the recess 32 can be provided on the lower electrode 11 without performing imprinting process at high accuracy.

In FIG. 12, the example where a square recess 32 has been formed is shown, but the shape of the recess 32 which is to be formed according to the embodiment is not limited to the square. For example, the shape of the recess 32 to be formed may be a square with rounded corners. Alternatively, a regular hexagonal, a regular triangular, a parallelogram, or trapezoidal recess 32 having sides parallel to three axes 40 to 42 of a hexagonal lattice may be formed in view of such a fact that the ordered structure of the block copolymer facilitates formation of a hexagonal lattice structure.

As explained above, according to the embodiment, even if the size of the storage cell is made small, the electrically conductive bodies 13 have an approximately equal shape and they are spaced and arranged at approximately equal intervals by the insulating layer 12, so that phase change occurs evenly in the phase change material layer 14. Therefore, it is possible to make properties of the storage cells approximately even and it is possible to reduce a current amount required for phase change sufficiently.

According to the method for manufacturing a phase change memory according to the embodiment, it is made possible to form electrically conductive bodies arranged in a pattern corresponding to an ordered structure of a block copolymer layer having an ordered structure where first polymer phases and second polymer phases have been regularly arranged and it is made easy to produce electrically conductive bodies regularly arranged and having an approximately equal shape, so that a phase change memory where storage cells having even performance have been arranged can be manufactured inexpensively.

EXAMPLE

The embodiment of the present invention will be further explained below with reference to Examples.

Example 1

Manufacture of Memory

Example 1 of the invention will be explained with reference to FIGS. 5A to 7B.

First, address lines and diodes for cell selection directly connected to the address lines were formed on a silicon substrate. Next, after an insulating film 12 made from $SiO_2$ was formed, a lower electrode 11 made from W were embedded by utilizing CVD process (see FIG. 5A). A shape of the lower electrode 11 was a square, 90 nm on one side. Similarly, after an electrically conductive layer 21 made from TiN was embedded and formed utilizing CVD process (see FIG. 5B), a block copolymer layer 22 was formed (see FIG. 5C). Specifically, solution obtained by dissolving di-block copolymer formed from polystyrene (PS) with a molecular weight of 110 thousands and polymethyl methacrylate (PMMA) with a molecular weight of 30 thousands in propylene glycol monomethyl ether acetate (PGMEA) was applied so as to form a film with a film thickness of 50 nm utilizing spin coating process. Phase separation was conducted to form an ordered structure by conducting annealing at 210° C. for 30 hours in a hydrogen-reducing atmosphere.

Next, recesses 24a shown in FIG. 5D were formed. Specifically, a polymer layers made from the PMMA were removed by performing RIE for 20 seconds under conditions of an oxygen flow rate of 20 sccm, a total pressure of 30 mTorr, and an input RF power of 300 W.

Figure 17:
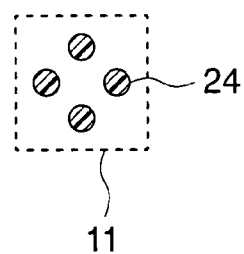
FIG. 17 is an illustrative diagram of a surface of the block copolymer from which a polymer phase of PMMA has been removed, which is observed using an atomic force microscope.

At that time point, when a surface of the block copolymer layer were observed utilizing an atomic force microscope, it was confirmed that recesses with a diameter of about 30 nm and a depth of about 20 nm were arranged in a cross shape such that two thereof were spaced by about 50 nm in a longitudinal direction and the remaining two were spaced by about 50 nm in a lateral direction, as shown in FIG. 17.

Next, as shown in FIG. 6A, a layer made from SOG was formed as the second resist layer 25. Specifically, the SOG was dissolved in ethyl lactate and solution thus obtained was applied utilizing spin coat process. Further, as shown in FIG. 6B, etching was performed to the coating. Specifically, RIE was performed on the SOG for 100 second under conditions of an oxygen flow rate of 20 sccm, a total pressure of 30 mTorr, and a total input RF power of 100 W.

Next, the resist layers 23 and 25 were removed and the electrically conductive layer 21 were processed by performing RIE for 60 seconds under conditions of an oxygen flow rate of 20 sccm, a total pressure of 30 mTorr, and an input RF power of 300 W (see FIG. 6C). When a shape of the processed electrically conductive layer 21 was observed utilizing an atomic force microscope, it was confirmed that electrically conductive bodies with a diameter of about 30 nm were arranged in a cross shape such that two thereof were spaced by about 50 nm in a longitudinal direction and the remaining two were spaced by about 50 nm in a lateral direction, as shown in FIG. 17. Electrically conductive bodies 13 arranged in a cross shape were obtained on the lower electrode 11.

Further, after an $SiO_2$ film was formed as the insulating film 12, a structure shown in FIG. 6D was obtained by surface treatment. Subsequently, after an $SiO_2$ film was formed as an insulating film, a phase change material layer 14 made from $Ge_2Sb_2Te_5$ was embedded using CVD process. Simultaneously, after an upper electrode 15 made from W was embedded using CVD process, word lines were formed, so that a phase change memory having a structure shown in FIG. 4 was manufactured.

Evaluation of Memory

One storage cell was selected, and application voltages and application time periods to the storage cell for crystallization and non-crystallization were evaluated. As a result, it was understood that it was suitable for crystallization to apply a current of 0.4 mA for 100 ns and it was suitable for non-crystallization to apply a current of 0.8 mA for 10 ns. By evaluating the variation among resistance values in crystal states regarding all the storage cells, such a result was obtained that a ratio of the maximum value to the minimum value was 10.

Example 2

Manufacture of Memory

A phase change memory according to Example 2 of the invention was manufactured. In the phase change memory according to the Example, the lower electrode 11 has approximately the same shape as those of the electrically conductive bodies 13.

A memory was manufactured like Example 1. Incidentally, the resist layer was etched utilizing RIE for 200 seconds under conditions of an oxygen flow rate of 20 sccm, a total pressure of 30 mTorr, and a total input RF power of 100 W, and the lower electrode was processed to have approximately the same shape as the electrically conductive body.

Evaluation of Memory

It was understood from evaluation made like Example 1 that it was suitable for crystallization to apply a current of 0.4 mA for 100 ns and it was suitable for non-crystallization to apply a current of 0.8 mA for 10 ns. By evaluating the variation among resistance values in crystal states regarding all the storage cells, such a result was obtained that a ratio of the maximum value to the minimum value was 8.

Example 3

Manufacture of Memory

A phase change memory according to Example 3 of the invention was manufactured. The phase change memory according to the Example was a phase change memory according to the second embodiment.

As shown in FIG. 13A, electrode material was embedded in an opening provided in the insulating film 12 to form a lower electrode 11, and an electrically conductive layer 21 was formed on the lower electrode 11 like Example 1.

Subsequently, novolac resin was applied to have a film thickness of 120 nm as the transfer layer 31 (see FIG. 13B). An original stamper disc with a projection formed in a square with one side of 70 nm was imprinted on a surface of the novolac resin with a pressure of 30 tons. Next, after irradiation of deep ultraviolet rays of 300 W for 3 minutes, anneal was performed at a temperature of 210° C. for 30 minutes, so that a pattern of the imprinted novolac resin was cured. As a result of positioning, a recess 32 having one side of 70 nm was formed at an approximately central portion of the lower electrode formed in a square with one side of 90 nm (see FIG. 13C).

Further, after block copolymer 22 was applied on the recess 32 like Example 1, self-ordering was achieved by performing anneal processing (see FIG. 13D). Here, solution obtained by dissolving di-block copolymer formed from polystyrene (PS) with a molecular weight of 80 thousands and PMMA with a molecular weight of 20 thousands in propylene glycol monomethyl ether acetate (PGMEA) was used and adjustment was conducted such that a film thickness of a film obtained from the solution was 40 nm.

Subsequently, removal of PMMA polymer phases 24 and spin coating of an SOG mask layer 25 were conducted like Example 1 (see FIGS. 14A and 14B). A pattern was transferred on the transfer layer 31 made from novolac resin by using the SOG mask layer 25 as a mask to etch the resist layer and the novolac resin utilizing oxygen RIE. Further, electrically conductive bodies 13 processed to approximately the same shape were obtained by applying Ar ion milling on the electrically conductive layer 21 for 2 minutes utilizing the transfer layer 31 made from novolac resin as a mask (see FIG. 14C).

Finally, the novolac resin 31 was removed by performing RIE for 2 minutes under conditions of an oxygen flow rate of 300 sccm, a total pressure of 200 mTorr, and an input RF power of 300 W. When the processed shape was observed utilizing an atomic force microscope, it was confirmed like the surface of the block copolymer that electrically conductive bodies 13 with a diameter of about 20 nm were arranged in a cross shape such that two thereof were spaced by about 40 nm in a longitudinal direction and the remaining two were spaced by about 40 nm in a lateral direction, as shown in FIG. 17.

Further, after an insulating film 12 made from $HfO_2$ and $Cr_2O_3$ was formed, a phase change material film 14 made from $Ge_2Sb_2Te_5$ was formed uniformly in the same manner as Example 1. Then, an insulating film 16, an upper electrode 15 and word lines were formed in this order so that a phase change memory was manufactured.

Subsequently, an initial anneal process was performed on the phase change memory. Specifically, the phase change memory was placed in a thermostatic bath set at a temperature of 120° C. and a current of 0.1 mA was caused to flow between the upper and lower electrodes for 1 second.

Evaluation of Phase Change Memory

It was found from evaluation performed like Example 1 that it was suitable for crystallization to apply a current of 0.3 mA for 100 ns and it was suitable for non-crystallization to apply a current of 0.6 mA for 10 ns. By evaluating the variation among resistance values in crystal states regarding all the storage cells, such a result was obtained that a ratio of the maximum value to the minimum value was 9. Since a region of the phase change material layer where phase change could occur was restricted as compared with Example 1, it was possible to further reduce a current amount required for phase change.

Example 4

Manufacture of Memory

A phase change memory according to Example 4 of the invention was manufactured. The phase change memory of Example 4 had a constitution that the lower electrode 11 had approximately the same shape as the electrically conductive body 13 in the phase change memory of Example 3. The phase change memory according to Example 4 was different from the phase change memory of Example 3 in that Ar ion milling was performed for 4 minutes using the novolac resin as a mask so that the lower electrode was also formed in approximately the same shape as the electrically conductive layer, but the former was formed in the same manner as latter except for the above difference.

Evaluation of Phase Change Memory

It was found from evaluation performed like Example 1 that it was suitable for crystallization to apply a current of 0.3 mA for 100 ns and it was suitable for non-crystallization to apply a current of 0.6 mA for 10 ns. By evaluating the variation among resistance values in crystal states regarding all the storage cells, such a result was obtained that a ratio of the maximum value to the minimum value was 9. Since a region of the phase change material layer where phase change could occur was restricted as compared with Example 1 like Example 3, it was possible to further reduce a current amount required for phase change.

Comparative Example 1

Manufacture of Memory

A phase change memory according to Comparative Example 1 was manufactured. The phase change memory of Comparative Example 1 was manufactured by a method similar to Example 1 except for the formation of di-block copolymer layer and the removal of the processed portion. The phase change memory of Comparative Example 1 thus obtained had the electrically conductive layer uniformly provided on the lower electrode. The phase change memory of Comparative Example 1 was different from the case of Example 1 in that the electrically conductive body 13 was not isolated into respective portions by the insulating film 12 but it was formed in a uniform layer.

Evaluation of Phase Change Memory

It was found from evaluation performed like Example 1 that it was suitable for crystallization to apply a current of 1.2 mA for 100 ns and it was suitable for non-crystallization to apply a current of 2.5 mA for 10 ns. By evaluating the variation among resistance values in crystal states regarding all the storage cells, such a result was obtained that a ratio of the maximum value to the minimum value was 20. As compared with Example 1, it was anticipated that, since the whole phase change material layer was heated without utilizing such a fact that heat was confined in the phase change material layer, a current amount required for phase change increased.

Comparative Example 2

Manufacture of Memory

A phase change memory of Comparative Example 2 was manufactured. The phase change memory of Comparative Example 2 was constituted such that, after the insulating layer 12 and the lower electrode 11 were formed, an insulating film was further formed and a portion of the insulating film which was larger than the lower electrode was removed in the phase change memory of Example 1. After an electrically conductive layer was provided at a portion corresponding to the entire of the removed region, a central portion of the electrically conductive layer was bored by performing etching process so that the electrically conductive layer was left at only a surrounding region thereof. Thereafter, an insulating film was formed in the bore again. That is, an electrically conductive layer with the same structure as disclosed in Patent Literature 1 was produced. The phase change memory shown in FIG. 1 was manufactured by utilizing steps subsequent to the insulating layer forming step which were the same steps as in Example 1.

Evaluation of Phase Change Memory

It was found from evaluation performed like Example 1 that it was suitable for crystallization to apply a current of 0.6 mA for 100 ns and it was suitable for non-crystallization to apply a current of 1.2 mA for 10 ns. By evaluating the variation among resistance values in crystal states regarding all the storage cells, such a result was obtained that a ratio of the maximum value to the minimum value was 50. Since two electrically conductive bodies, each coming in contact with the phase change material layer and having a size smaller than the same, were formed like Example 1, a current amount required for phase change was reduced. However, it was supposed that, since it was difficult to control positions and sizes of the two electrically conductive bodies, the ratio, or the variation among the resistance values, increased.

As explained above, according to the respective embodiments of the invention, even if a size of a storage cell is reduced, it is possible to set properties of storage cells to be approximately equal and it is possible to reduce a current amount required for phase change.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A manufacturing method of a phase change memory comprising:

forming a first electrode;

forming an electrically conductive layer on the first electrode;

forming a block copolymer layer having an ordered structure where first polymer phases and second polymer phases are approximately regularly arranged on the electrically conductive layer;

selectively removing the first polymer phases to form a plurality of recesses on a surface of the block polymer layer;

forming a plurality of electrically conductive bodies corresponding to the ordered structure of the block copolymer by utilizing the recesses as masks to perform etching process on the electrically conductive layer;

forming a high resistance film with a resistance higher than that of the electrically conductive bodies among the plurality of electrically conductive bodies;

forming a phase change material layer which can change its phase between a first phase state having a first specific resistance and a second phase state having a second specific resistance different from the first specific resistance on the plurality of electrically conductive bodies and the high resistance film; and forming a second electrode on the phase change material layer.

2. The manufacturing method of a phase change memory according to claim 1, wherein the electrically conductive layer has a feature pattern on a surface thereof before the block copolymer layer is formed, and the ordered structure of the block copolymer layer formed on the electrically conductive layer is oriented so as to correspond to the feature pattern.

3. The manufacturing method of a phase change memory according to claim 1, further comprising a step of forming a mask layer on the recesses, wherein a size of the pattern corresponding to the ordered structure is controlled by adjusting a filling amount of material for the mask layer.

* * * * *